Oct. 3, 1950 D. H. PREIST 2,524,175

KEYING OF HIGH-FREQUENCY OSCILLATORS

Filed June 28, 1945

Inventor

DONALD H. PREIST

By Ralph L. Chappell

Attorney

Patented Oct. 3, 1950 2,524,175

UNITED STATES PATENT OFFICE 2,524,175

KEYING OF HIGH-FREQUENCY OSCILLATORS

Donald H. Preist, Bromley, England, assignor to Minister of Supply, in His Majesty's Government of the United Kingdom of Great Britain and Northern Ireland, London, England Application June 28, 1945, Serial No. 601,955

3 Claims. (Cl. 250—36)

Figure 1:
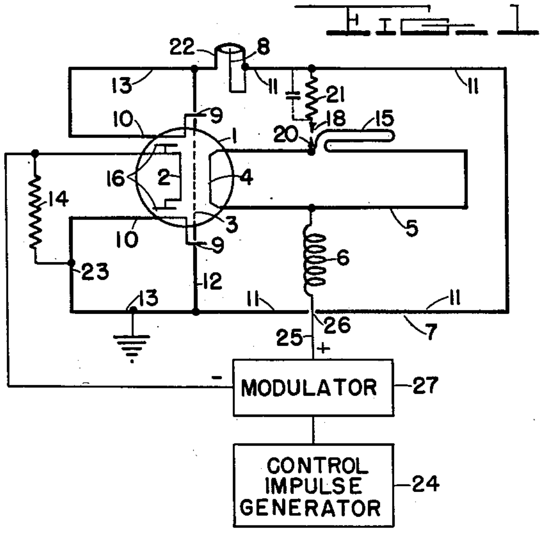

This invention relates to keying high frequency oscillators, and is particularly directed to a method and means for improving such oscillators by reducing the time delay between activation of the oscillator and achievement of constant amplitude oscillations therein.

In many applications of high frequency oscillators, including radio echo ranging, oscillators are required to deliver alternating current energy in intermittent impulses of a few micro seconds duration, each impulse comprising a large number of radio frequency cycles. Systems producing such impulses comprise a normally inoperative oscillator which is intermittently activated by application of a uni-directional voltage impulse to one of the electrodes of the oscillator tube. The voltage impulse which actuates the oscillator tube is made as nearly rectangular in waveform as possible, but the distributed capacitances involved in practical circuits render it impossible to produce an activating impulse with zero rise-time. The minimum effective activating impulse rise-time attainable in practice is of the order of one-tenth microsecond.

The frequencies employed in impulse modulated oscillators are normally very high, being of the order of $10^9$ cycles per second. In consequence the application to an oscillator of an activating impulse having a rise-time of one-tenth microsecond causes no appreciable shock-excitation in the oscillator tank circuit, since the rise-time, from the view point of the tank circuit, is extremely gradual, consuming one hundred or more oscillation periods.

Inasmuch as shock excitation from the activating impulse is not effective to start oscillations, an impulse modulated oscillator must depend for a starting force upon some random electrical disturbance in the tank circuit. When a random disturbance occurs which contains an appreciable component at the oscillator frequency, a minute transient oscillation is set up in the tank circuit and the regenerative action of the oscillator tube builds up the oscillation to the maximum amplitude which the energy from the tube is capable of sustaining.

Two undesirable consequences result from the oscillator's reliance on random disturbances as starting forces. First, the delay between the application of the activating impulse and attainment of full-amplitude oscillations is in many applications sufficient to effect sizable energy variations in the short impulses. Second, the random nature of the disturbances which initiate oscillations makes it impossible to control accurately the times at which high frequency impulses are initiated. This disadvantage is particularly serious in high-precision echo-ranging systems.

Elimination of the above-described effects being highly desirable, it is accordingly an object of this invention to provide a method applicable to impulse modulated high frequency oscillators effective to reduce and stabilize the time delay between activation of the oscillator and attainment of constant amplitude oscillations therein.

A further object of this invention is to provide a means for reducing and stabilizing the time delay between the activation of an oscillator and establishment of constant amplitude oscillations therein.

According to the invention, means are provided coupled to the oscillator tank circuit operative to set up therein transient oscillations simultaneously with or slightly prior to the application of an activating voltage impulse to the oscillator tube. The activated tube thus finds oscillations of proper frequency and appreciable amplitude already present in the tank circuit, and as a result it builds the oscillations up to full amplitude in a minimum number of periods. Moreover, because the oscillations are always present when the oscillator tube begins to deliver energy to the tank circuit, the time delay is relieved of the random aspects present with former techniques and is thus much more clearly constant than in previously existing oscillators. In the embodiments of the invention described herein, a spark discharge is employed as an initiating force to set up transient oscillations. The properties of a spark discharge make it well suited to this purpose; the current-time graph of a spark discharge contains very closely spaced irregularities or "spikes" with extremely steep sides. Hence the spark current contains components of appreciable amplitude even at the very high frequencies employed in impulse modulated oscillator applications.

Figure 2:
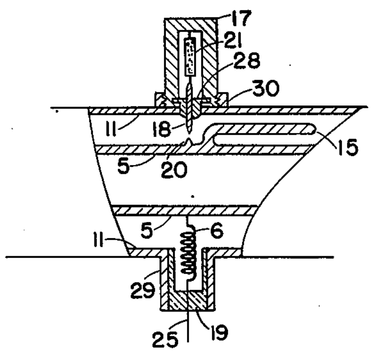
Figure 3:
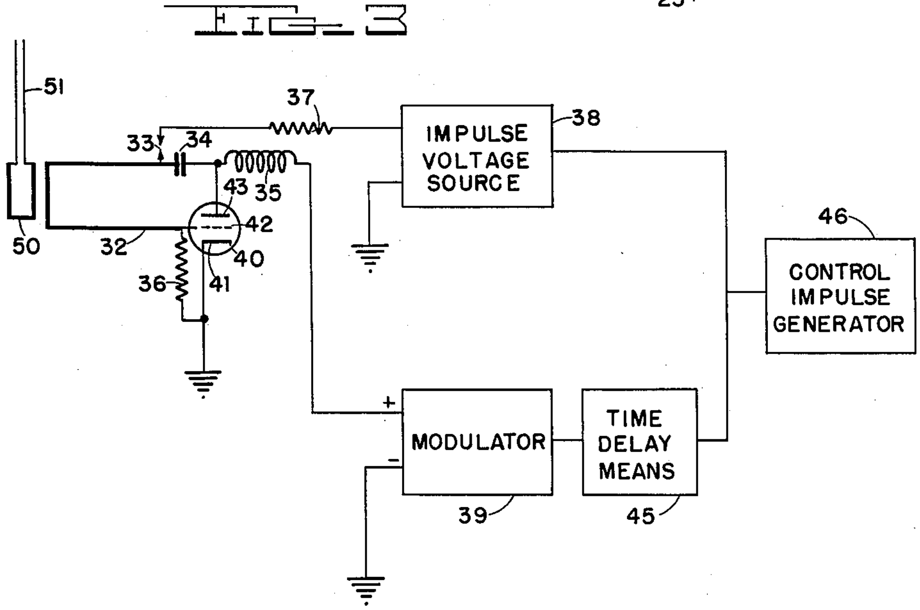

Further description of the invention will be with reference to the appended drawings, in which Figure 1 is a diagrammatic showing of one embodiment of the invention, as incorporated in a high frequency oscillator;

Figure 2 is a sketch in cross section of a part of the oscillator of Figure 1; and Figure 3 is a showing partly schematic and partly in block form, of another embodiment of the invention.

Figure 1 is a conventionalized diagram of a coaxial line oscillator showing the coaxial components of the oscillator in simplified cross section and using schematic symbols to represent the other circuit elements. The high frequency oscillator therein portrayed is of the type using sections of coaxial line as tank circuits; triode vacuum tube 1 is of the lighthouse type, having cathode 2, grid 3, and plate 4. The cathode is heated; the heater element is not shown in the diagram. The tube 1 is enclosed within tubular element 7, made of conducting material. Element 7 is divided into two portions by circular partition 12, also of conducting material. Electron tube 1 is mounted in an aperture at the center of partition 12, and grid 3 is conductively connected to partition 12. Tubular element 10, which is centered within and connected to element 7 by end plate 23, is coupled capacitively to cathode 2 by condensers 16. Grid leak resistor 14 is connected from cathode 2 to the outer surface of end plate 23, from which there is a conductive path to grid 3 for direct current, through element 7 and partition 12. Tubular element 5 is centered within element 7 and is conductively connected to plate 4 of tube 1. Uni-directional impulses of voltage are intermittently applied to plate 4 by modulator 27 responsively to control impulses from generator 24. The modulator and control impulse generator are represented in block form. The plate voltage impulses from the modulator are carried to plate 4 through radio-frequency choke coil 6 by wire 25, which passes through a small aperture 26 in the wall of element 7. The plate tank circuit of the oscillator comprises inner surface 11 of element 7 and the outer surface of element 5, cooperating to form a half-wave-length open-circuited coaxial transmission line. The cathode tank circuit comprises the inner surface 13 of element 7 and the outer surface of element 10, cooperating to form a quarter-wave-length coaxial transmission line short-circuited by the inner surface of circular end-plate 23. Partition 12 effectively isolates the plate and cathode tank circuits from one another; hence a feedback path is provided comprising small fingers 9, made of conducting material, connected to the cathode line and protruding through small apertures in partition 12 into the field of the plate line. Radio frequency energy may be extracted from the plate tank by coupling loop 8 and output coaxial line 22.

Member 15 conductively connected to tubular element 5 is a harmonic suppression device; its length is one-quarter of the wavelength of the oscillator's second harmonic. Being connected at a point on element 5 which would normally be a voltage maximum for the second-harmonic component, member 15 effectively prevents second harmonic current from circulating in the plate tank circuit.

Spark gap electrodes 18 and 20 are connected in series with a high impedance between element 5 and element 7. In the embodiment shown the impedance comprises resistor 21 in parallel with the distributed capacitance across its terminals as shown in the drawing. When a high voltage D.-C. impulse is applied to tube 1 by modulator 27, the same voltage is applied across spark-gap electrodes 18 and 20. This voltage causes the gap to spark over and the ultra high frequency components of current in the spark discharge initiate oscillations in the plate tank circuit of the oscillator. Simultaneously therewith tube 1 is activated and the transient oscillations initiated by the spark, instead of dying out, are reinforced and very rapidly built up to full amplitude by the energy supplied by the tube. The impedance in series with the spark gap is so high that the energy drawn from the tank circuit during tube operation by the spark gap and impedance is of negligible quantity.

The part of the plate tank circuit containing the spark gap apparatus is shown in cross section in Figure 2. The cross section is taken through the axis of tubular element 7. Concentrically disposed within element 7 is tubular element 5, the inner conductor of the coaxial line. Extending outward from element 7 at right angles thereto is a short hollow cylindrical stub 29, having mounted therein an insulating insert 19 containing a cylindrical recess coaxial with the stub. Housed within the recess in insert 19 is choke coil 6, one end of which is connected to element 5, the inner conductor of the coaxial line. The other end of choke coil 6 is connected to lead 25 which is brought out through a small aperture in insert 19. Harmonic suppressor 15 may be constructed as an integral part of element 5 as shown; it is conductively connected at one end to element 5 and is oriented in the space between elements 5 and 7 parallel to their axis.

Electrode 20, which forms a part of the spark gap as hereinbefore described, is shown as integrally formed with element 5. Alternatively, it may be welded or otherwise affixed to element 5, the inner conductor of the coaxial line. Adjacent to electrode 20 and suitably spaced therefrom is a second electrode 18, which is mounted in an insulating sleeve 28 extending transversely through an aperture in the wall of element 7. Sleeve 28 is fitted within a recess in hollow cylindrical housing 17. Housing 17 is made of conducting material. The end of housing 17 opposite from sleeve 28 is closed off, and resistor 21 is enclosed within the housing, one of its terminals being connected to the housing, the other terminal being connected to electrode 18. Housing 18 is externally threaded at its end adjacent to sleeve 28 and is secured to element 7 by being screwed into ring 30. Ring 30 is affixed to the outer wall of element 7 concentrically with the aperture admitting sleeve 28, and is threaded internally to receive housing 18.

From the foregoing description of the oscillator and its operation, it will be seen that power oscillation of the circuit is obtained by auxiliary excitation of the tank circuit to generate preliminary resonant frequency components therein during the rise of plate voltage in the oscillator.

Figure 3 shows in schematic and block form another embodiment of the invention, and application of the inventive method. In this embodiment means are provided whereby a spark discharge initiates oscillations in the oscillator tank circuit before the oscillator tube is activated, thus insuring that transient oscillations will be well developed in the tank circuit at the instant the tube starts to function. The oscillator employs the Colpitts circuit; the tank circuit is transmission line section 32, short-circuited at one end. Coupling loop 50 and transmission line 51 are provided to convey radio frequency energy from the tank circuit to an external load. Triode tube 40, having plate 43, grid 42, and cathode 41, is the oscillator electron tube. Cathode 41 is heated; the heater element is not shown. One open terminal of line section 32 is connected to grid 42; the other is connected through blocking condenser 34 to plate 43. Grid leak 36 is connected between grid 42 and cathode 41. Plate 43 is connected to the positive output terminal of modulator 39 through radio frequency choke coil 35. One electrode of spark gap 33 is connected to the open end of line 32 adjacent to condenser 34; the other electrode of spark gap 33 is connected through high resistance 37 to the positive terminal of impulse voltage source 38. Cathode 41, the negative terminal of modulator 39, and the negative terminal of impulse voltage source 38 are all grounded. Control impulse generator 46 is connected directly to voltage source 38 and is connected to modulator 39 through time delay means 45.

Modulator 39 is a low-impedance source which produces, responsively to control impulses at its input, high voltage positive impulses which are applied to the plate of tube 40. Voltage source 38 likewise, responsively to control impulses at its input, produces high voltage impulses which break down spark gap 33 and cause spark-discharge currents to circulate in transmission-line tank circuit 32. Because resistance 37 limits the current from source 38 to a low value, source 38 need not have low internal impedance. The time delay means 45 is operative to cause each control impulse from generator 38 to be applied to modulator 39 a very short time after the impulse is applied to voltage source 38. In a practical case this delay interval might be of the order of one-quarter microsecond.

In this embodiment, each control impulse is first operative to apply a large voltage across the gap, break it down, and produce transient oscillations in the oscillator tank circuit. Then, after transient oscillations are well established, the main power impulse is applied to the oscillator tube by the modulator and the tube very rapidly builds up the oscillation in the tank circuit to a steady amplitude. The total delay between application of the modulator impulse and the attainment of constant amplitude is much less than when the oscillator is started without pre-excitation of the tank circuit.

It will be understood that the embodiments of the invention herein shown and described are exemplary only, and the scope of the invention is to be determined with reference to the appended claims.

What is claimed is:

1. In combination, an oscillator having a vacuum tube and resonant tank circuit means coupled thereto, normally inactive power supply means operative to energize the oscillator, normally inactive shock-excitation means operative to generate transient oscillations in the resonant circuit means, and control means operative to activate the shock-excitation means and thereafter to activate the power supply means during the duration of the transient oscillations in the resonant circuit means.

2. In combination, an oscillator having a vacuum tube and resonant tank circuit means coupled thereto, normally inactive power supply means operative to energize the oscillator, control means operative to activate the power supply means, and spark gap means operative responsively to the control means to pass spark discharge currents through the resonant circuit means and thereby to generate transient oscillations therein simultaneously with the activation of the power supply means.

3. A high frequency impulse generator having a coaxial tank circuit with inner and outer members, said members being coupled for power generation to elements of an electron tube structure, a unidirectional voltage pulse generator connected to the members to establish a high potential difference therebetween for energizing the generator, and shock excitation means comprising a spark gap between the members connected directly to one and through a capacity and a high resistance in parallel to the other, whereby on generator energization direct shock excitation of the coaxial tank circuit occurs through spark gap breakdown.

DONALD H. PREIST.

REFERENCES CITED

The following references are of record in the file of this patent:

UNITED STATES PATENTS

| Number | Name | Date |
|---|---|---|
| 1,695,042 | Fearing | Dec. 11, 1928 |
| 2,037,799 | Koch | Apr. 21, 1936 |
| 2,103,090 | Plebanski | Dec. 21, 1937 |
| 2,153,202 | Nichols | Apr. 4, 1939 |
| 2,252,293 | Ohl | Aug. 12, 1941 |
| 2,392,380 | Varian | Jan. 8, 1946 |
| 2,410,087 | Litton | Oct. 29, 1946 |
| 2,416,367 | Young, Jr. | Feb. 25, 1947 |
| 2,418,121 | Hoffman | Apr. 1, 1947 |